United States Patent
Iida et al.

(10) Patent No.: US 6,206,974 B1
(45) Date of Patent: Mar. 27, 2001

(54) SUBSTRATE PROCESSING SYSTEM, INTERFACE APPARATUS, AND SUBSTRATE TRANSPORTATION METHOD

(75) Inventors: Naruaki Iida; Yukio Shigaki, both of Kumamoto (JP)

(73) Assignee: Tokyo Electron Ltd., Tokyo (JP)

( * ) Notice: Subject to any disclaimer, the term of this patent is extended or adjusted under 35 U.S.C. 154(b) by 0 days.

(21) Appl. No.: 09/196,734

(22) Filed: Nov. 20, 1998

(30) Foreign Application Priority Data

Nov. 28, 1997 (JP) .................................................. 9-369876

(51) Int. Cl.[7] .................................................. C23C 16/00
(52) U.S. Cl. ........................ 118/719; 118/52; 118/56; 118/66; 118/668; 118/712; 118/641; 118/319; 118/320; 118/500; 118/708; 118/715; 118/719; 414/935; 414/936; 414/937; 414/941
(58) Field of Search ................................. 118/668, 712, 118/641, 52, 56, 66, 319, 320, 719, 500, 708; 414/936, 935, 937, 941

(56) References Cited

U.S. PATENT DOCUMENTS 5,387,288 * 2/1995 Shattas .................................. 118/723
5,565,034 * 10/1996 Nanbu et al. .......................... 118/668
5,725,664   3/1998 Nanbu et al. ............................ 118/52

* cited by examiner

Primary Examiner—Deborah Jones
Assistant Examiner—Lymarie Miranda
(74) Attorney, Agent, or Firm—Rader, Fishman & Grauer

(57) ABSTRACT

An interface apparatus places, in a boat, plural wafers transported thereto one by one from an application apparatus for performing single wafer processing, then transports the boat having the wafers placed therein to a heating apparatus for subjecting plural wafers to a heat treatment process, and after completion of the heat treatment process, receives the boat. The interface apparatus includes a stage, a rotary table rotatably arranged on the stage for placing the boat thereon, and a positioning mechanism for turning the rotary table in a direction of displacement of the boat to permit the boat to be placed on the rotary table when the boat is being placed on the rotary table with the position thereof displaced from a reference position in a rotatable direction of the rotary table, and after completion of the placement, turning the rotary table in a direction opposite to the displacement direction to thereby position the boat at the reference position.

40 Claims, 10 Drawing Sheets

SUBSTRATE PROCESSING SYSTEM, INTERFACE APPARATUS, AND SUBSTRATE TRANSPORTATION METHOD

BACKGROUND OF THE INVENTION

The present invention relates to a substrate processing system for forming a film such as an interlayer insulation film, an interface apparatus used in the system, and a substrate transportation method.

In the process of manufacture of semiconductor devices, in general, a predetermined circuit pattern is formed on a surface of each substrate to be processed, for example, a semiconductor wafer or the like, by using photolithography technique. Meanwhile, with recent improvement in the integration of semiconductor devices, more and more circuit patterns have come to be formed in layers, and in such a multilayer wiring structure, it is essential that irregularities of a lower wiring should be as small as possible. Studies have therefore been focused on techniques of flattening an interlayer insulation film for insulating a lower wiring from an upper wiring.

As a conventional method for flattening an interlayer insulation film, a method using SOG (Spin On Glass) is known. In the SOG application method, a processing solution (SOG solution) containing a silanol compound such as Si(OH)4, which is a constituent of a film to be obtained, mixed in ethyl alcohol or the like as a solvent is applied to a wafer, which is a substrate to be processed, and the wafer is subjected to a heating process to allow the solvent to evaporate and advance the polymerization reaction of the silanol compound, thereby forming an insulation film.

More specifically, a wafer is placed on a spin chuck, and with the wafer rotated at a rotational speed of 2000 to 6000 rpm, the SOG solution is made to drip onto the wafer so that the solution may be applied to the wafer, thereby forming an SOG film. Subsequently, the SOG film is subjected to a preheating process at 100 to 140° C. to evaporate the solvent, and then further to a heating process at a temperature of about 400° C. so that the silanol compound forming the SOG film may be polymerized by means of siloxane bonds. In cases where SOG films are to be formed in layers, the step of applying the SOG solution to a wafer and evaporating the solvent is repeated and then the wafer is subjected to the heating process, or the step of applying the SOG solution to the wafer and evaporating the solvent and the heating process are repeatedly carried out.

A coating apparatus for applying the SOG solution to surfaces of wafers employs a spin coating method wherein, with a single wafer rotated as stated above, the SOG solution is made to drip onto the wafer surface so that the solution may be spread over and applied to the wafer. Thus, wafers are coated with the SOG solution one by one according to so-called single wafer processing.

In a heating apparatus for subjecting wafers to a heating process after the application of the SOG solution, on the other hand, batch process is employed in view of operating efficiency wherein a plurality of wafers are held by a wafer boat and the wafer boat is transported into a heater to subject the wafers collectively to the heating process.

Thus, the application of the SOG solution, which is single wafer processing, and the heating process, which is batch processing, need to be carried out with the use of respective different apparatuses, and therefore, an interface apparatus is provided for transporting semiconductor wafers applied with the solution by the application apparatus to the heating apparatus.

In the interface apparatus, plural wafers, which have been transported one by one from the application apparatus, are placed one over another in a boat, and the boat carrying the wafers is conveyed into the heating apparatus by a transporting arm of the heating apparatus.

In the heating apparatus, the plural wafers are subjected to a heating process together with the boat, and after the heating process, the wafer boat carrying the wafers is returned to the interface apparatus by the transporting arm of the heating apparatus.

The interface apparatus has a stationary stage provided therein for permitting a plurality of boats to be placed thereon side by side, and is constructed such that before and after the transportation of each boat to and from the heating apparatus, the boat is placed exactly at a reference position on the stationary stage.

Occasionally, however, the boat is placed with shift position in a direction of rotation (circumferential direction) displaced from the reference position, and in this case an alarm is issued. If this occurs, the operator must correct the circumferential position of the boat; however, this operation is complicated.

BRIEF SUMMARY OF THE INVENTION

One object of the present invention is to provide a substrate processing system whereby, even if a substrate holding member, such as a wafer boat or the like, is transported to a stationary stage in an interface apparatus with the circumferential position thereof displaced, such displacement can be automatically corrected, so that the substrate holding member can be positioned with accuracy.

Another object of the present invention is to provide an interface apparatus for use in the substrate processing system.

Still another object of the present invention is to provide a substrate transportation method whereby, even if the substrate holding member is transported to the stationary stage in the interface apparatus with the circumferential position thereof displaced when substrates are conveyed via the interface apparatus, such displacement is automatically corrected and thus the substrate holding member can be accurately positioned.

According to a first aspect of the present invention, there is provided a substrate processing system comprising: a first processing apparatus for performing single substrate processing on each of substrates to be processed; a second processing apparatus for performing batch processing on plural substrates to be processed with the substrates held by a substrate holding member; and an interface apparatus to which the substrates processed by the first processing apparatus are transported one by one, the interface apparatus causing the substrates to be held by the substrate holding member, transporting the substrate holding member holding plural substrates to the second processing apparatus, and after completion of the batch processing, retrieving the substrate holding member, the interface apparatus including a stage, a rotary table rotatably arranged on the stage, for placing the substrate holding member thereon, and positioning means for turning the rotary table in a direction of displacement of the substrate holding member to permit the substrate holding member to be placed on the rotary table when the substrate holding member is being placed on the rotary table with a shift position thereof displaced from a reference position in a rotatable direction of the rotary table, and after completion of placement of the substrate holding member, turning the rotary table in a direction opposite to the displacement direction to thereby position the substrate holding member at the reference position.

According to a second aspect of the present invention, there is provided an interface apparatus for placing in a substrate holding member a plurality of substrates transported thereto one by one from a first processing apparatus for performing single substrate processing on each of substrates to be processed, then transporting the substrate holding member having the plural substrates placed therein to a second processing apparatus for performing batch processing, and after completion of the batch processing, receiving the substrate holding member, the interface apparatus comprising: a stage, a rotary table rotatably arranged on the stage, for placing the substrate holding member thereon; and positioning means for turning the rotary table in a direction of displacement of the substrate holding member to permit the substrate holding member to be placed on the rotary table when the substrate holding member is being placed on the rotary table with a shift position thereof displaced from a reference position in a rotatable direction of the rotary table, and after completion of placement of the substrate holding member, turning the rotary table in a direction opposite to the displacement direction to thereby position the substrate holding member at the reference position.

According to a third aspect of the present invention, there is provided a substrate transportation method for transporting substrates to be processed one by one to an interface apparatus after each of the substrates is subjected to single substrate processing by a first processing apparatus, placing plural substrates in a substrate holding member, transporting the substrate holding member having the plural of substrates placed therein to a second processing apparatus for subjecting batch processing to second processing, and after completion of the second processing, returning the substrate holding member to the interface apparatus, the substrate transportation method comprising the steps of: turning a rotary table rotatably arranged on a stage inside the interface apparatus, in a direction of displacement of the substrate holding member to permit the substrate holding member to be placed on the rotary table when the substrate holding member is being placed on the rotary table with a shift position thereof displaced from a reference position in a rotatable direction of the rotary table; and turning the rotary table in a direction opposite to the displacement direction after completion of placement of the substrate holding member, to thereby position the substrate holding member at the reference position.

According to a fourth aspect of the present invention, there is provided a substrate transportation method for transporting substrates to be processed one by one to an interface apparatus after each of the substrates is subjected to single substrate processing by a first processing apparatus, placing plural substrates in a substrate holding member, transporting the substrate holding member having the plural substrates placed therein to a second processing apparatus for subjecting batch processing to second processing, and after completion of the second processing, returning the substrate holding member to the interface apparatus, the substrate transportation method comprising the steps of: preparing urging means for urging a rotary table rotatably arranged on a stage inside the interface apparatus in opposite rotatable directions thereof such that the rotary table is always returned to a reference position; turning the rotary table in a direction of displacement of the substrate holding member with a guide pin of the rotary table engaged and guided by the substrate holding member, against an urging force of the urging means to permit the substrate holding member to be placed on the rotary table when the substrate holding member is being placed on the rotary table with a shift position thereof displaced from the reference position in a rotatable direction of the rotary table; and turning the rotary table in a direction opposite to the displacement direction and returning the rotary table to the reference position by the urging force of the urging means after completion of placement of the substrate holding member, to thereby position the substrate holding member at the reference position.

According to the present invention, when the substrate holding member is being placed with its position displaced from the reference position in a rotatable direction of the rotary table which is rotatably arranged on the stage inside the interface apparatus, the rotary table is turned in the direction of displacement to permit the substrate holding member to be placed on the rotary table, and after the placement is completed, the rotary table is turned in the opposite direction to thereby position the substrate holding member at the reference position. Accordingly, when the substrate holding member is transported to the interface apparatus from the second processing apparatus which performs so-called batch processing, it can be automatically positioned as the rotary table turns. This makes it unnecessary for the operator to carry out position correction which is required in conventional systems, thereby eliminating complicated operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be hereinafter described in detail with reference to the accompanying drawings.

Figure 1:
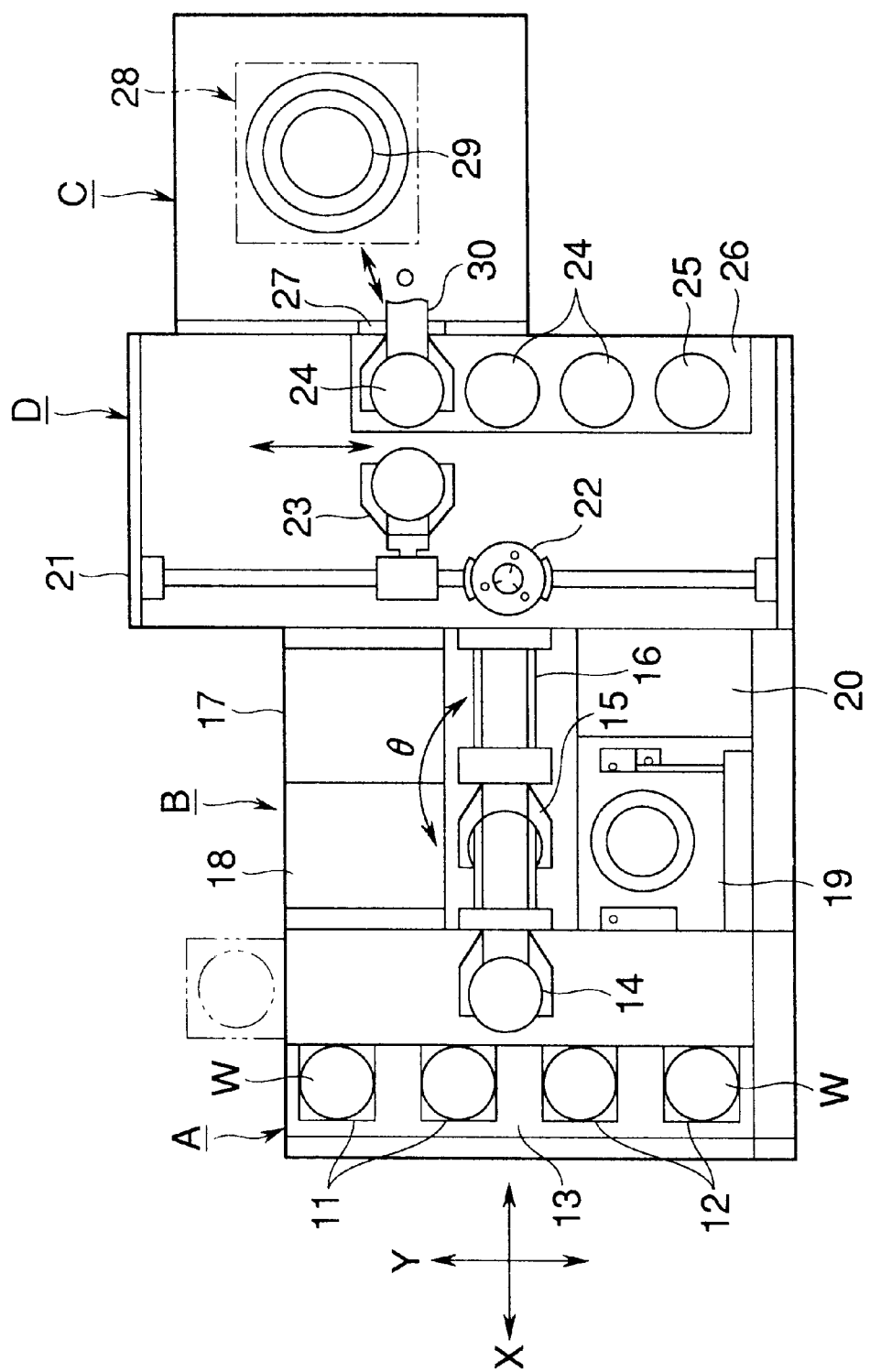
FIG. 1 is a plan view schematically showing a substrate processing system according to one embodiment of the present invention.
Figure 2:
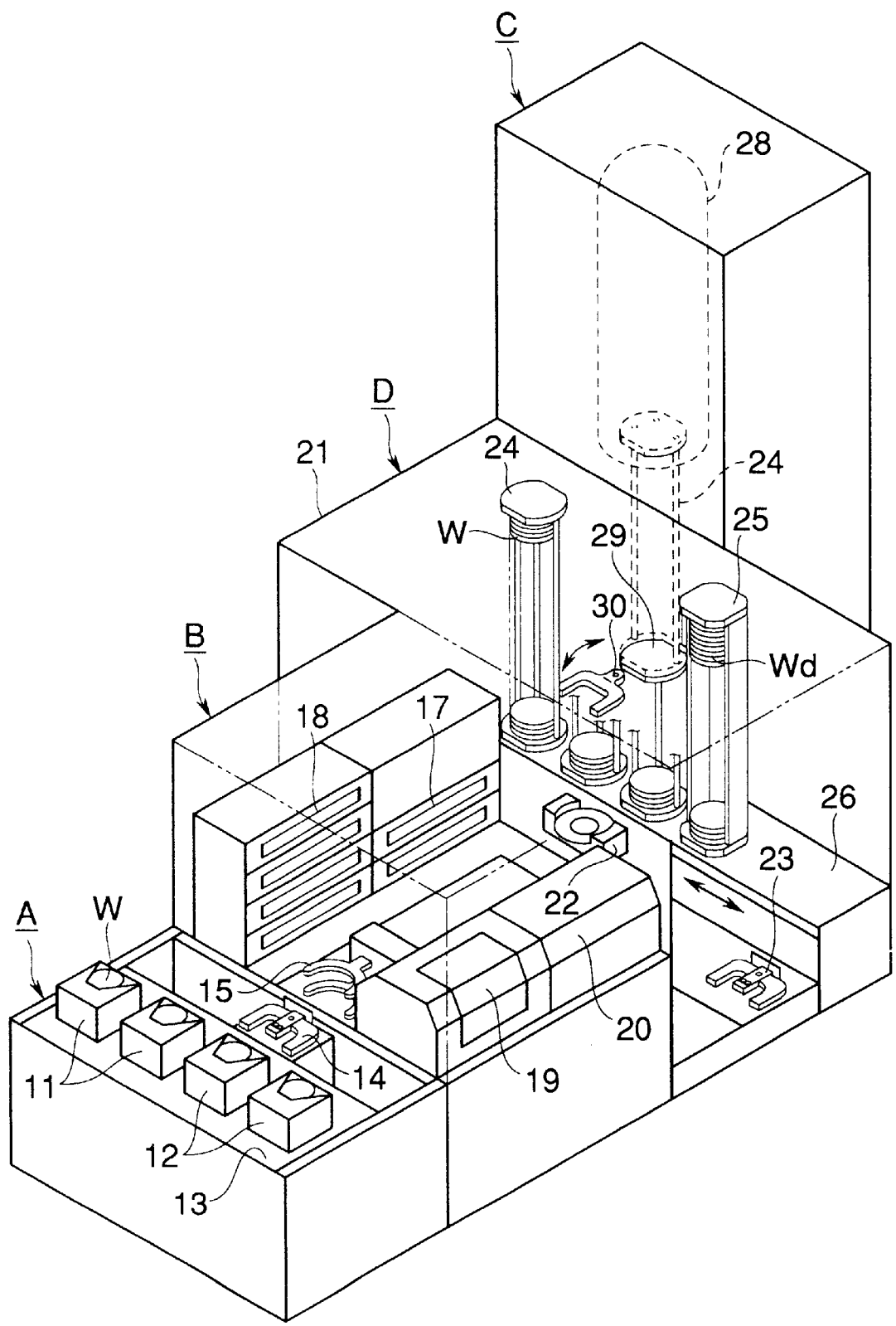
FIG. 2 is a perspective view schematically showing the arrangement of the substrate processing system of FIG. 1.

FIG. 1 schematically shows, in plan view, a substrate processing system according to one embodiment of the present invention, and FIG. 2 schematically shows, in perspective view, the substrate processing system of FIG. 1.

The substrate processing system has a principal part thereof made up of a load-unload section A from and to which are conveyed semiconductor wafers W, which are substrates to be processed, a coating apparatus B for applying an SOG solution as a processing liquid to each of the wafers W transported there to from the load-unload section A according to single wafer processing, a heating apparatus C for subjecting the wafers W, which have been applied with the SOG solution, collectively to a heating process according to batch processing, and an interface apparatus D for transporting the wafers W between the coating apparatus B and the heating apparatus C.

The load-unload section A has a table 13 on which wafer cassettes 11 for containing unprocessed semiconductor wafers W and wafer cassettes 12 for containing processed wafers W are arranged in line. A wafer transporting arm 14 movable in X and Y directions (horizontally) as well as in a Z direction (vertically) is arranged in a facing relation to openings of the wafer cassettes 11 and 12.

In the load-unload section A constructed as above, the wafer transporting arm 14 takes an unprocessed wafer W out of a wafer cassette 11 and conveys same to a transfer position near the central portion of the system, whereupon a wafer transporting handler 15 of the coating apparatus B receives the wafer, which is then subjected to an applying process. The wafer W which has been subjected to the applying and heating processes is transported to the transfer position while being held by the wafer transporting handler 15, received by the wafer transporting arm 14 and conveyed to a wafer cassette 12 for processed wafers.

On one side of a transportation path 16 in the coating apparatus B are arranged cooling mechanisms 17 for cooling a wafer W not applied with the SOG solution yet to a room temperature, and a plurality of baking mechanisms 18 stacked one upon another for heating wafers W applied with the SOG solution to a target temperature (e.g., 100 to 140° C.) to evaporate the solvent of the solution. On the other side of the transportation path 16 opposite the mechanisms 17 and 18, a coating mechanism 19 for applying the SOG solution as a processing liquid by causing the solution to drip on a surface of a wafer W cooled by the cooling mechanism 17 and a chamber 20 for housing a tank (not shown) containing a chemical such as the SOG solution are arranged.

The interface apparatus D has a substantially closed box 21, in which are arranged a positioning mechanism 22 for receiving and positioning a wafer W conveyed from the coating apparatus B and a transporting mechanism 23 for receiving a wafer W from the positioning mechanism 22 and conveying same to and from a wafer boat 24 (substrate holding member). Also inside the interface apparatus D, a boat liner 26 (stage), on which a plurality of (three in the figures) boats 24 and a single dummy wafer boat 25 are placed, is arranged in a manner such that it is movable in opposite directions along the axis Y.

The heating apparatus C communicates with the interface apparatus D via an opening window 27, and includes a vertical heating furnace 28, a boat elevator 29 arranged under the furnace 28 for moving the boat 24 up and down to convey the same to and from the furnace 28, and a transporting mechanism 30 for transporting the boat 24 between the boat liner 26 of the interface apparatus D and the boat elevator 29, all arranged therein.

Figure 3:
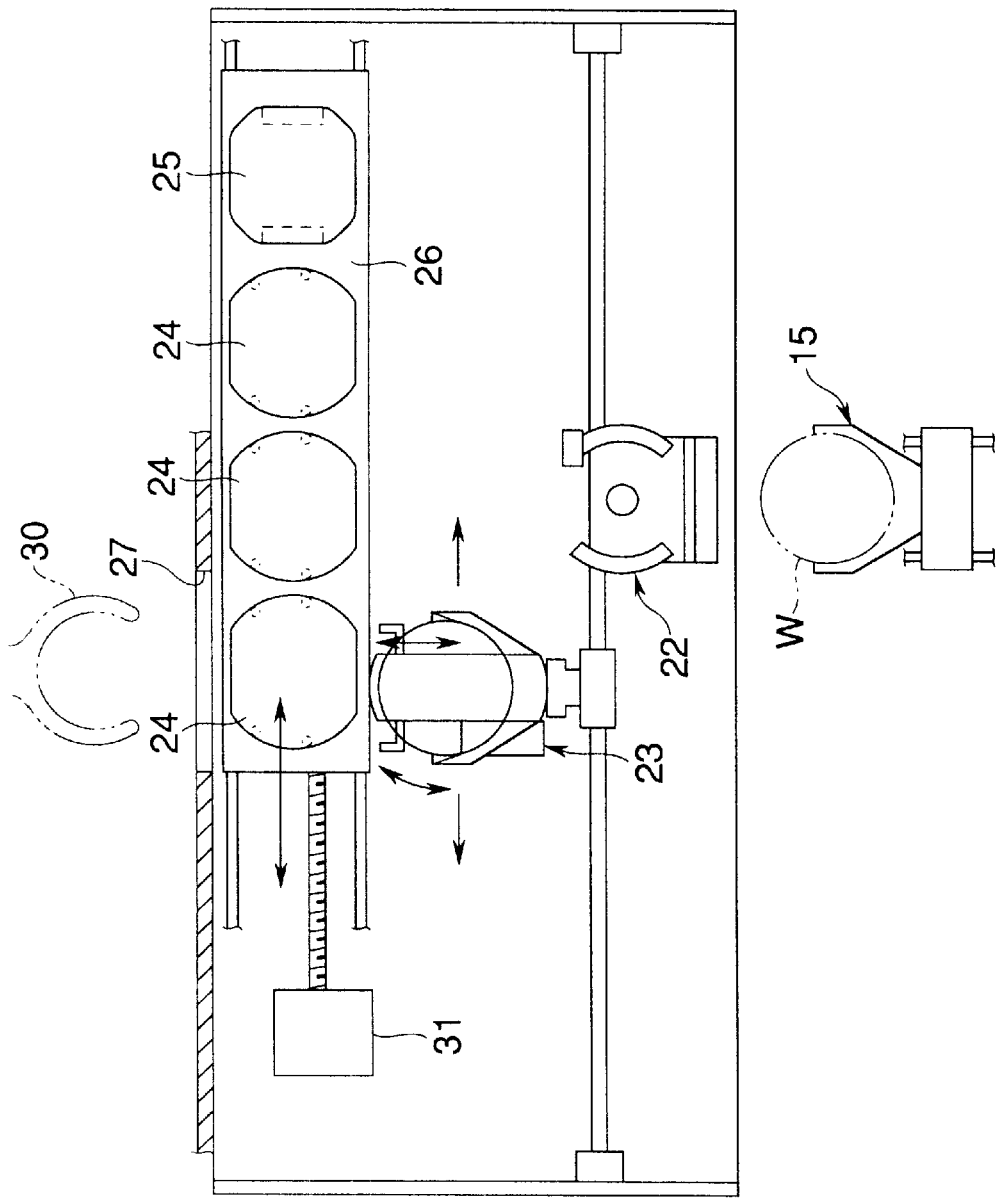
FIG. 3 is a plan view of an interface apparatus mounted to the substrate processing system shown in FIG. 1.

FIG. 3 shows, in plan view, the interface apparatus D mounted to the substrate processing system of FIG. 1, and as illustrated in FIG. 3, the boat liner 26 in the interface apparatus D is constructed so as to be movable in the Y direction by means of a feed screw mechanism 31. The dummy wafer boat 25, which is fixed on the boat liner 26, and the three boats 24 are arranged side by side. By thus arranging the boats 24 and 25 adjacent to one another, it is possible to quickly place dummy wafers Wd at the top and bottom of the boat 24 when wafers W are placed in the boat 24 by the transporting mechanism 23.

Specifically, each boat 24 is capable of containing sixty wafers W, for example. A maximum of fifty product wafers W, for example, is placed at an intermediate portion of the boat 24, and above and below the fifty product wafers W, five dummy wafers Wd from the boat 25 are placed, respectively. With a total of sixty wafers contained, the boat 24 is transported to the heating apparatus C to be subjected to the heating process.

Figure 4A:
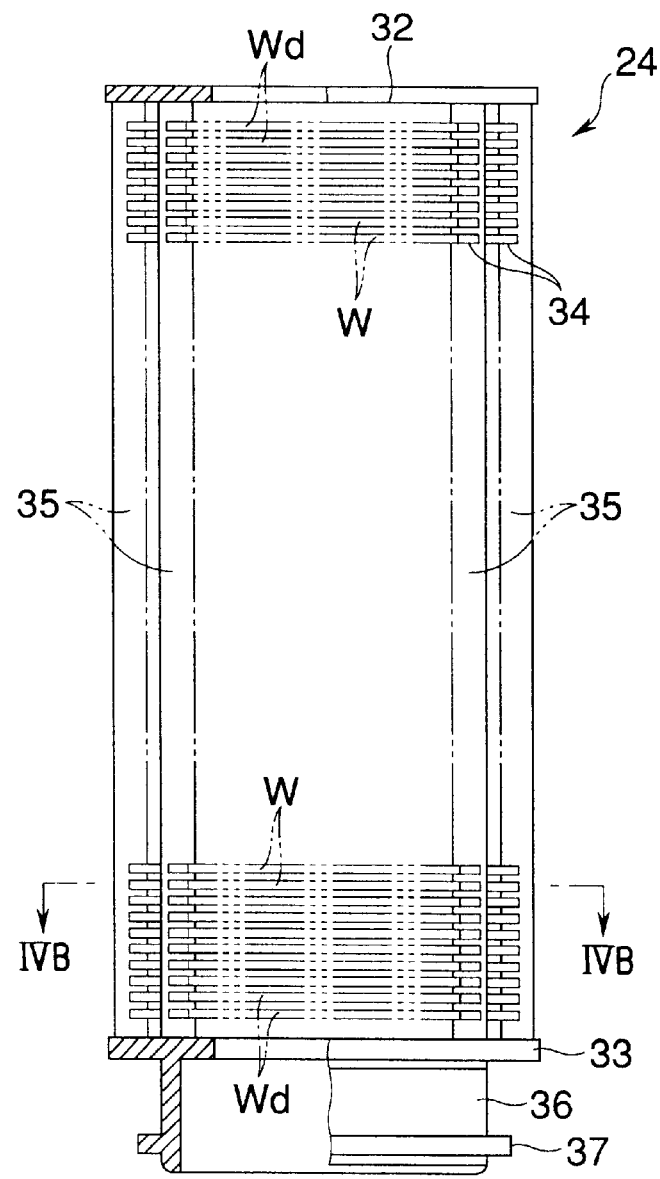
FIG. 4A is a side view of a wafer boat.
Figure 4B:
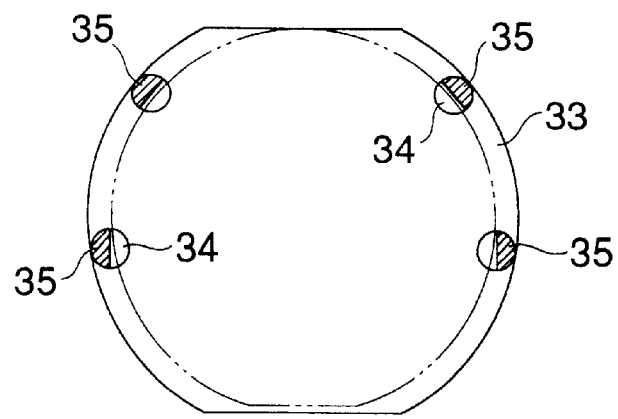
FIG. 4B is a sectional view taken along line VB—VB shown in FIG. 4A.

As shown in FIGS. 4A and 4B, the boat 24 comprises upper and lower base plates 32 and 33 facing each other, and four wafer holding rods 35 extending between the two base plates and wafer retaining grooves 34 formed therein, the grooves being spaced at a suitable distance from one another in the longitudinal direction. The lower base plate 33 has a cylindrical portion 36 securely attached to the underside thereof, and a flange 37 is formed at a lower part of the cylindrical portion 36. The boat 24 having the structure stated above is in its entirety made of quartz or silica glass so that particles of the wafer material, metal or the like may not be produced at portions where the boat 24 contacts with the wafers W, for example, at the wafer retaining grooves 34.

The heating apparatus will be now described.

Figure 5:
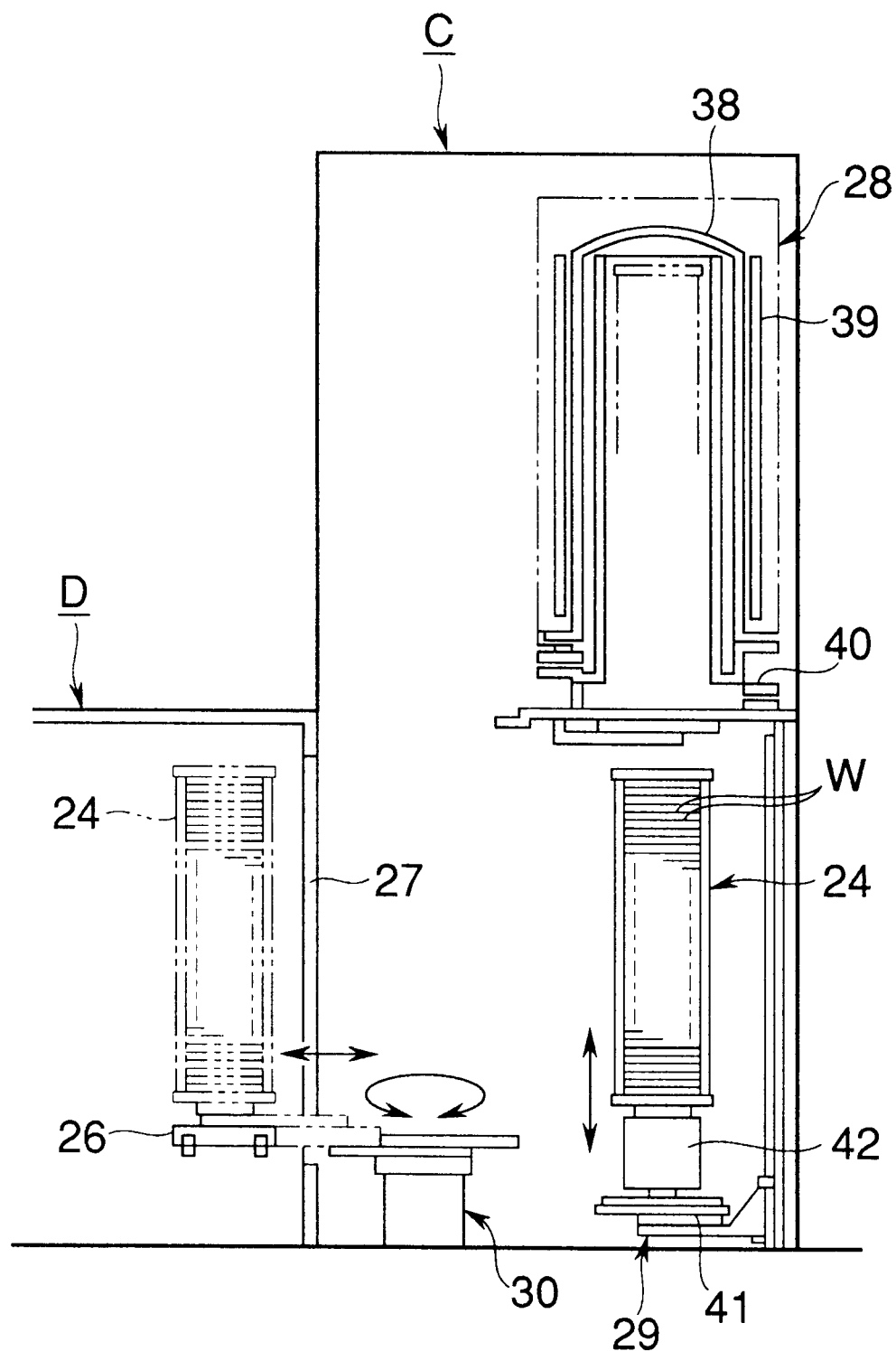
FIG. 5 is a vertical sectional view of a heating apparatus mounted to the substrate processing system shown in FIG. 1.

As shown in FIG. 5, a process tube 38 made of quartz and having an inverted U-shaped longitudinal section is housed in the furnace 28 of the heating apparatus C, and a heater 39 is arranged around the outer periphery of the process tube 38 so as to surround the tube 38. A manifold 40 is connected to a lower open end of the process tube 38, and an inlet pipe (not shown) for introducing a predetermined processing gas into the process tube 38 and a discharge pipe (not shown) for discharging the gas after the heating process are connected to the manifold 40. The boat elevator 29 has a cover member 41 which comes into close contact with the manifold 40 to keep the interior of the process tube 38 sealed from outside, and also has a heat insulating cylinder 42 mounted at a portion thereof above the cover member 41.

Figure 6:
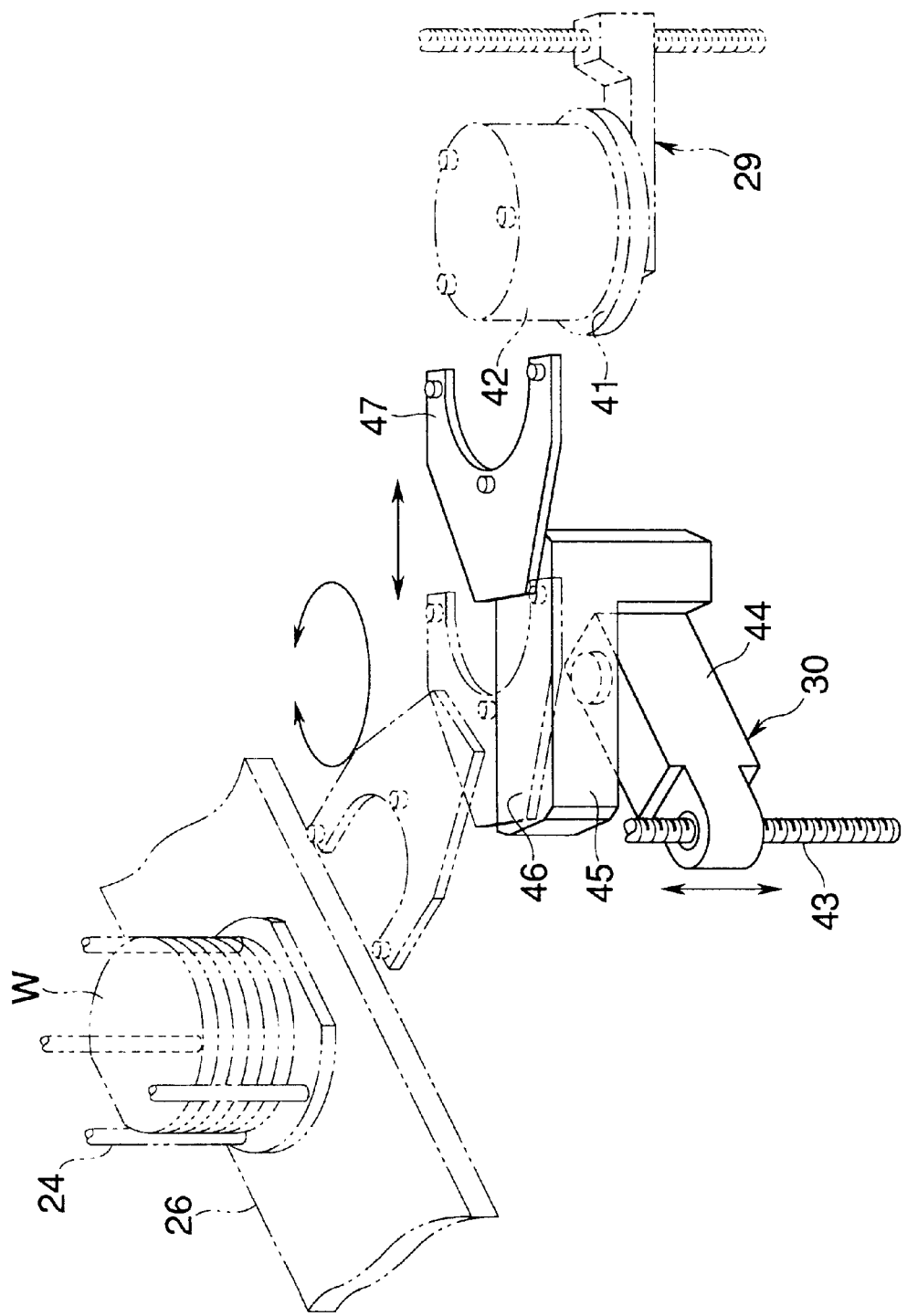
FIG. 6 is a perspective view schematically showing a transporting mechanism in the heating apparatus.

As shown in FIG. 6, the transporting mechanism 30 in the heating apparatus C has an elevating base 44 vertically movable along a ball screw 43 and a rotary driving section 45 rotatably mounted on the elevating base 44. A boat placement arm 47 having a U-shaped distal end portion is arranged in such a manner that it is slidable along a guide groove 46 formed in the upper surface of the rotary driving section 45. Thus, the boat placement arm 47 can receive the boat 24 on the boat liner 26 and transfer same to the boat elevator 29, and after the heating process, it can transfer the boat 24 from the boat elevator 29 to the boat liner 26.

In this embodiment, a boat positioning mechanism 50 is provided on the boat liner 26. Referring now to FIGS. 7A through 10, the boat positioning mechanism 50 will be described.

Figure 7A:
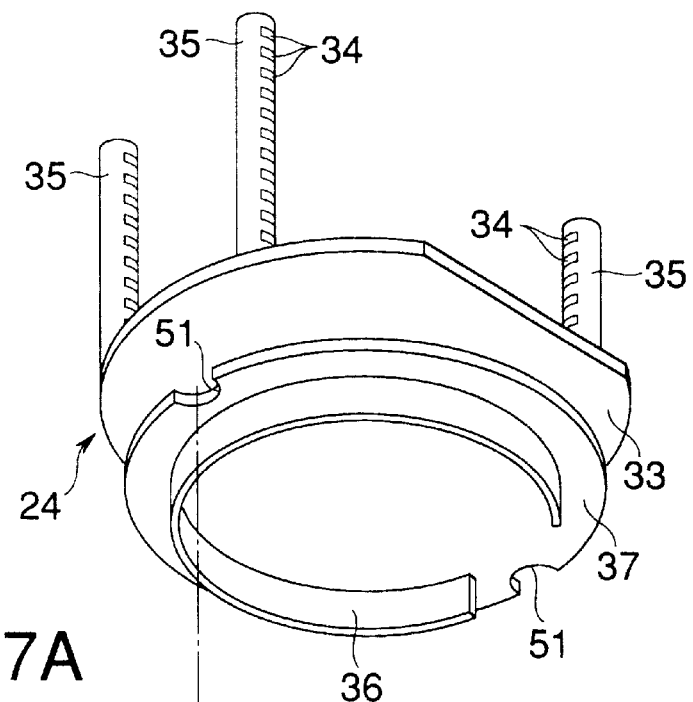
FIGS. 7A and 7B respectively show a boat being positioned as viewed obliquely from below and a boat positioning mechanism as viewed obliquely from above.
Figure 7B:
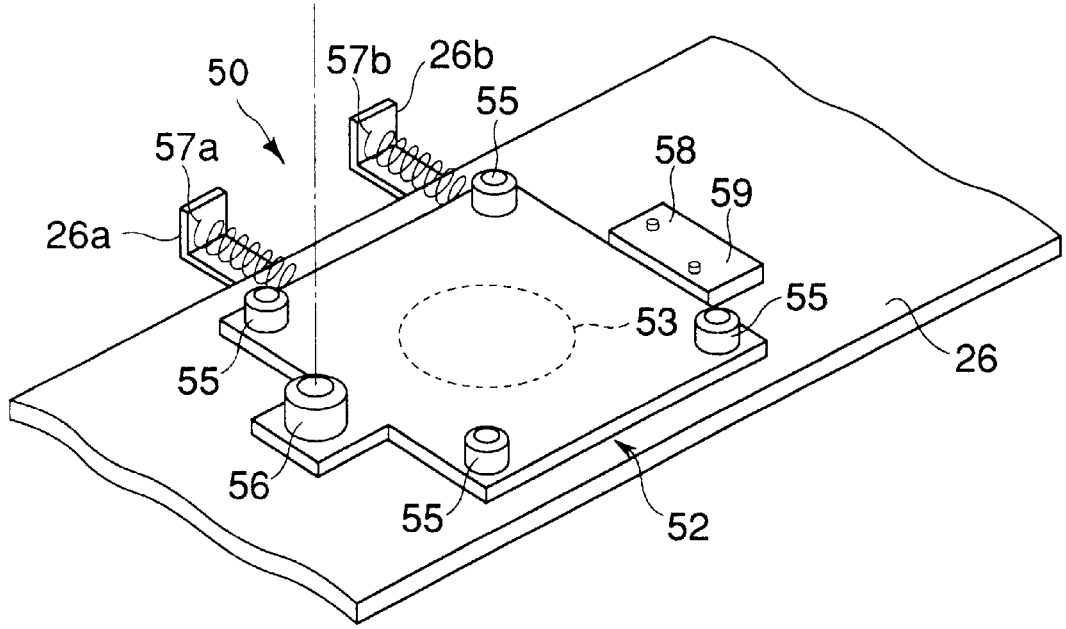
Figure 8:
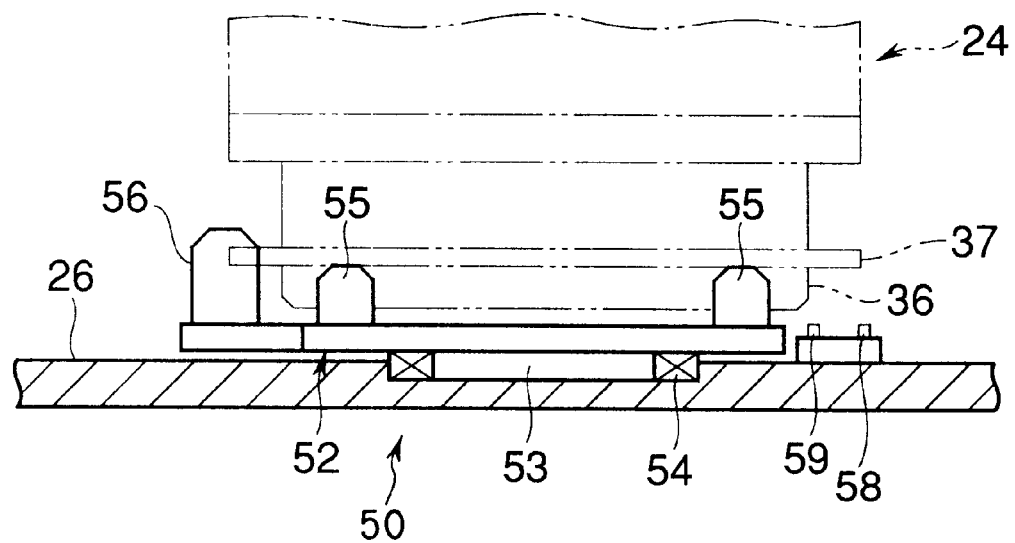
FIG. 8 is a sectional view showing the boat positioning mechanism.
Figure 9:
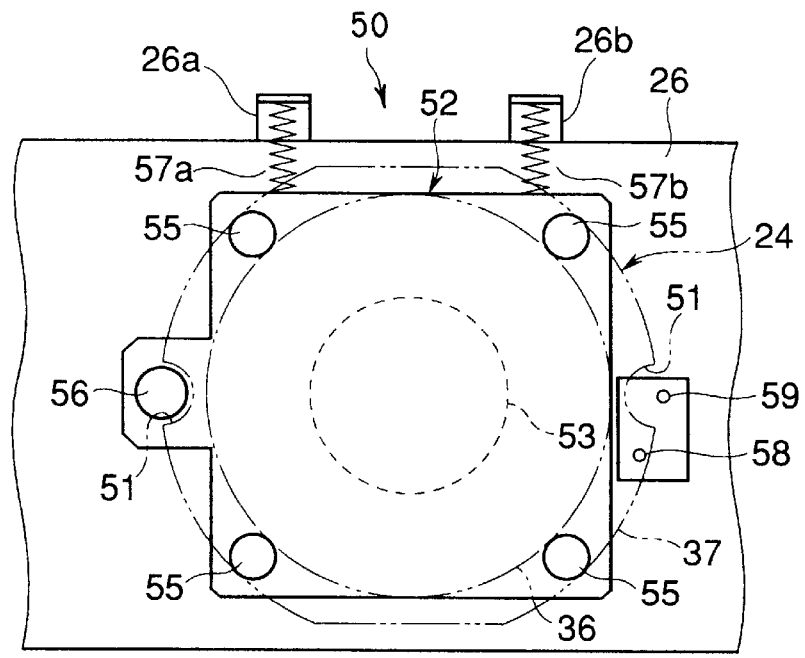
FIG. 9 is a plan view showing the boat positioning mechanism.

FIGS. 7A and 7B respectively show the boat being positioned as viewed obliquely from below and the boat positioning mechanism 50 as viewed obliquely from above, FIG. 8 shows the boat positioning mechanism 50 in section, FIG. 9 shows the boat positioning mechanism 50 in plan view, and FIG. 10 also shows the boat positioning mechanism 50 in plan view and illustrates a case where the circumferential position of the boat 24 is displaced.

As shown in FIGS. 7A to 9, cut portions 51 are formed in the flange 37 of the boat 24 for engagement with a guide pin 56, described later. As part of the boat positioning mechanism 50, a disc-shaped pivot 53 of a rotary table 52 is partly buried in the upper surface of the boat liner 26 via a bearing 54, so that the rotary table 52 is rotatable on the boat liner 26. Four fixed pins 55 are arranged at four corners of the rotary table 52, respectively, such that when the boat 24 is placed on the rotary table, the pins 55 engage with the outer peripheral surface of the cylindrical portion 36 of the boat 24 and at the same time support the flange 37. Further, the guide pin 56 is arranged on a protruding portion of the rotary table 52 such that when the boat 24 is placed on the rotary table, the guide pin comes into engagement with one of the cut portions 51. A pair of coil springs (urging means) 57a and 57b each have one end attached to the rotary table 52 and the other end attached to a corresponding one of fixed members 26a and 26b protruding from the boat liner 26. When the rotary table 52 is turned in one of rotatable directions thereof, the coil springs 57a and 57b exert their urging forces on the table 52 in respective opposite directions. Thus, even if the rotary table 52 is turned in either direction, it is always returned to a reference position by the urging forces of the coil springs 57a and 57b.

In the vicinity of the rotary table 52 of the boat liner 26 are arranged a boat sensor 58 for detecting presence/absence of the boat 24 and a boat displacement sensor 59 for detecting displacement of the boat 24 from the reference position.

The operation of the boat positioning mechanism 50 constructed as stated above will be now described.

After the plural wafers W placed in the boat 24 are subjected to the heating process inside the process tube 38, the boat 24 is lowered by the boat elevator 29 as shown in FIG. 6, then held and carried by the boat placement arm 47 of the transporting mechanism 30 toward the boat liner 26 in the interface apparatus D. The boat 24 is transported up to a position above the boat liner 26 by the boat placement arm 47, is lowered by the arm 47 and placed on the rotary table 52 (see FIGS. 7A to 9) of the boat liner 26.

Figure 10:
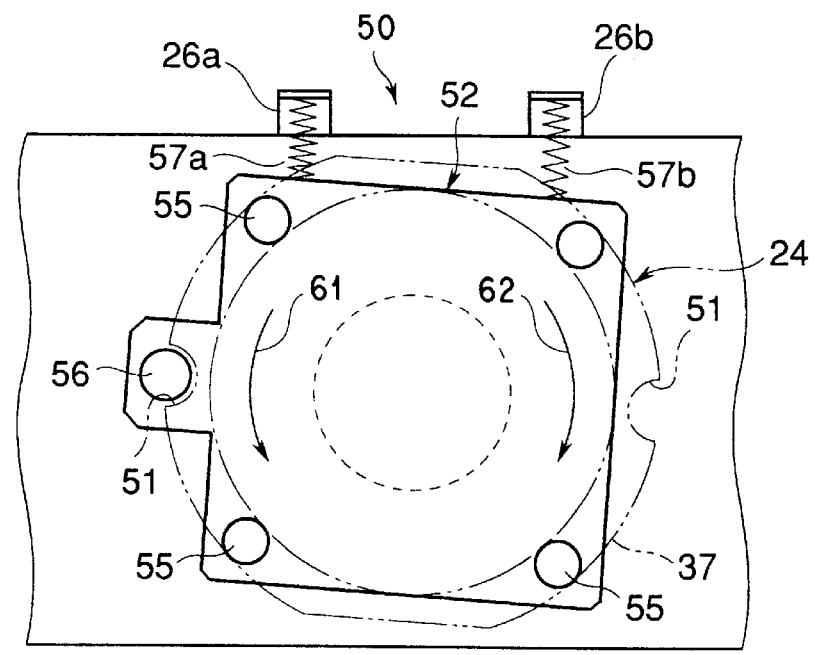
FIG. 10 is a plan view of the wafer boat positioning mechanism, illustrating a case where the circumferential position of the boat is displaced.

If, at the time of lowering and placing the boat 24 on the rotary table 52, the circumferential position of the boat 24 is displaced in the clockwise direction (arrow 62) as shown in FIG. 10, the boat 24 lowers with the cut 51 thereof engaged with the guide pin 56 of the rotary table 52. At this time, since the holding force of the boat placement arm 47 surpasses the urging force of the spring 57a, the rotary table 52 turns in the direction in which the boat 24 is displaced, that is, in the clockwise direction (arrow 62), against the urging force of the spring 57a as the cut 51 descends in contact with the guide pin 56.

In this manner, the boat 24 is placed on the rotary table 52 with the latter turned in the displacement direction, that is, in the clockwise direction (arrow 62), and the boat placement arm 47 starts to retract, whereupon the placement of the boat 24 is completed. After completion of the placement, the holding force of the boat placement arm 47 is released, and therefore, the rotary table 52 is turned in the counterclockwise direction (arrow 61) by the urging force of the spring 57a and returned to the predetermined placement position. Consequently, the boat 24 is positioned at the predetermined placement position.

Thus, when the boat 24 is transported to the interface apparatus D from the heating apparatus C which performs batch processing, the rotary table 52 turns so that the boat 24 can be automatically positioned, and accordingly, the operator need not correct the boat position, eliminating complicated operation.

Figure 11:
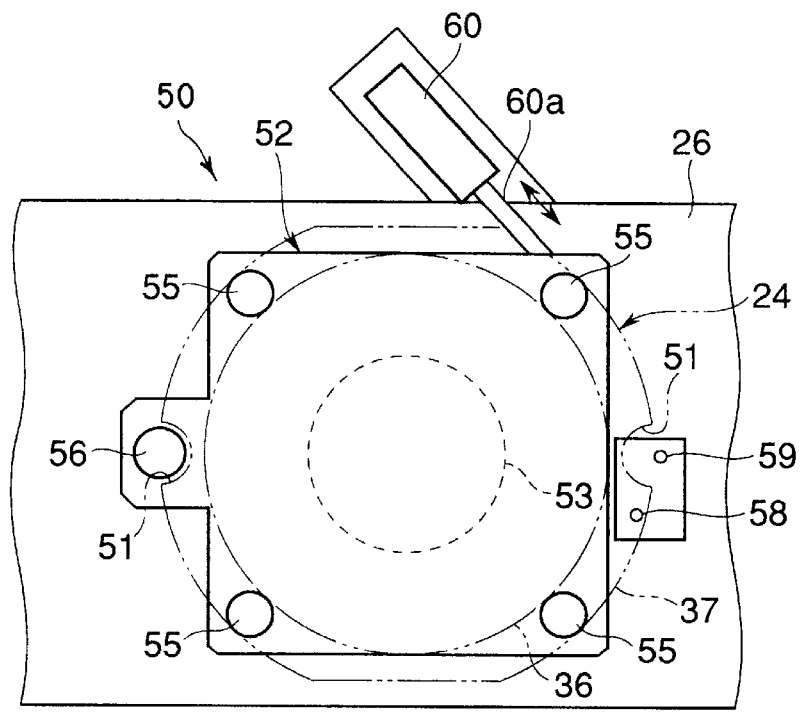
FIG. 11 is a plan view showing a modification of the boat positioning mechanism.
Figure 12:
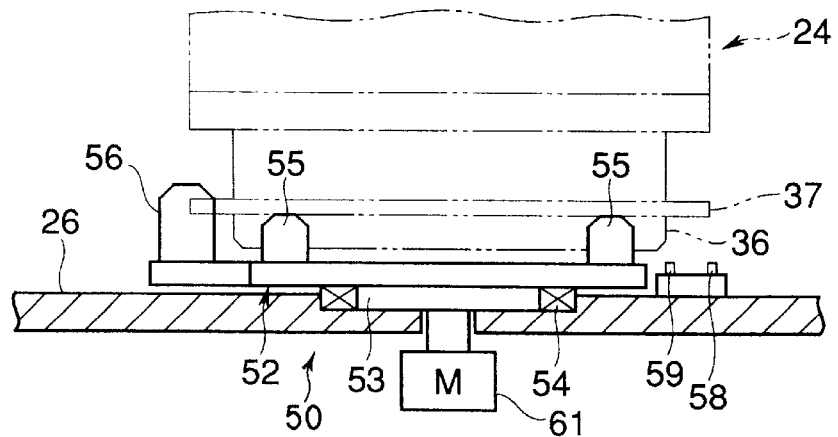
FIG. 12 is a sectional view showing another modification of the boat positioning mechanism.

Referring now to FIGS. 11 and 12, modifications of the boat positioning mechanism according to the present invention will be described.

In the modification shown in FIG. 11, a cylinder 60 is used in place of the aforementioned coil springs 57a and 57b in such a manner that a distal end of a piston 60a thereof is attached to the rotary table 52. With this arrangement, when the rotary table 52 is turned because of displacement of the boat 24, the circumferential position of the rotary table 52 is returned to the original position by the cylinder 60. In the modification shown in FIG. 12, instead of using the aforementioned coil springs 57a and 57b, a motor 61 is arranged under the pivot 53 to turn the rotary table 52 through the pivot 53. With this arrangement, when the rotary table 52 is turned because of displacement of the boat 24, the circumferential position of the rotary table 52 is returned to the original position by the motor 61.

The present invention is not limited to the embodiments described above and may be modified in various ways. For example, although in the above embodiments, semiconductor wafer is taken as an example of substrate to be processed, the present invention may be applied to other substrates than semiconductor wafers, for example, LCD substrates.

Further, the foregoing description of the embodiments is directed to the case where the application apparatus is used as an apparatus for performing single substrate processing and the heating apparatus is used as an apparatus for performing batch processing on substrates placed in the substrate holding member, but the present invention is not limited to such applications alone.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing system comprising:
   a first processing apparatus for performing single substrate processing on each of substrates to be processed;
   a second processing apparatus for performing batch processing on plural substrates to be processed with the substrates held by a boat;

an interface apparatus to which the substrates processed by said first processing apparatus are transported one by one, said interface apparatus causing the substrates to be held by the boat, transporting the boat holding plural substrates to said second processing apparatus, and after completion of the batch processing, retrieving the boat;

a first transfer mechanism for loading/unloading the substrate into/from the boat in the interface apparatus; and a second transfer mechanism for transferring the boat in the interface apparatus to the second processing apparatus, said interface apparatus including:
a stage,
a rotary table rotatably arranged on said stage, for placing the boat thereon, and
positioning means for turning said rotary table in a direction of displacement of the boat to permit the boat to be placed on said rotary table when the boat is being placed on said rotary table with a shift position thereof displaced from a reference position in a rotatable direction of said rotary table by said second transfer mechanism, and after completion of placement of the boat, turning said rotary table in a direction opposite to the displacement direction to thereby position the boat at the reference position.

2. The substrate processing system according to claim 1, wherein said positioning means comprises:
a guide pin arranged on said rotary table, for guiding the boat when the boat is placed on said rotary table, and
urging means for urging said rotary table in opposite rotatable directions thereof to return said rotary table to the reference position,
wherein when the boat is being placed with the shift position thereof displaced from the reference position in a rotatable direction of said rotary table, said rotary table turns in a direction of displacement of the boat against an urging force of the urging means as the boat is guided by the guide pin, and when placement of the boat is completed, said rotary table turns in a direction opposite to the displacement direction and returns to the reference position due to the urging force of the urging means.

3. The substrate processing system according to claim 2, wherein the urging means comprises a pair of coil spring for urging said rotary table in rotatable directions thereof opposite to each other.

4. The substrate processing system according to claim 2, wherein the boat has a cut portion formed therein, the boat being guided with the cut portion thereof engaged with the guide pin.

5. The substrate processing system according to claim 1, wherein said positioning means comprises a cylinder mechanism for turning said rotary table.

6. The substrate processing system according to claim 5, further comprising a guide pin arranged an said rotary table for guiding the boat when said boat is placed on said rotary table, and wherein when the boat is being placed with the shift position thereof displaced from the reference position in a rotatable direction of said rotary table, the boat is guided by said guide pin, and when placement of the boat is completed, said rotary table is turned in a direction opposite to said rotatable direction and returned to the reference position by the cylinder mechanism.

7. The substrate processing system according to claim 1, wherein said positioning means comprises a motor for turning said rotary table.

8. The substrate processing system according to claim 7, further comprising a guide pin arranged on said rotary table for guiding the boat when the boat is placed on said rotary table, and wherein when the boat is being placed with the position thereof displaced from the reference position in a rotatable direction of said rotary table, the boat is guided by the guide pin, and when placement of the boat is completed, said rotary table is turned in a direction opposite to said rotatable direction and returned to the reference position by said motor.

9. The substrate processing system according to claim 1, wherein said first processing apparatus comprises a coating apparatus for applying a process solution to a substrate to be processed, and said second processing apparatus comprises a heating apparatus for subjecting the substrate to a heat treatment process.

10. An interface apparatus for placing in a boat a plurality of substrates transported thereto one by one from a first processing apparatus for performing single substrate processing on each of substrates to be processed, then transporting the boat having the plural substrates placed therein to a second processing apparatus for performing batch processing, and after completion of the batch processing, receiving the, boat said interface apparatus comprising:

a stage;
rotary table rotatably arranged on said stage, for placing the boat thereon; and
positioning means for turning said rotary table in a direction of displacement of the boat to permit the boat to be placed on said rotary table when the boat is being placed on said rotary table with a shift position thereof displaced from a reference position in a rotatable direction of said rotary table, and after completion of placement of the boat, turning said rotary table in a direction opposite to the displacement direction to thereby position the boat at the reference position.

11. The interface apparatus according to claim 10, wherein said positioning means comprises:
a guide pin arranged on said rotary table, for guiding the boat when the boat is placed on said rotary table; and
urging means for urging said rotary table in opposite rotatable directions thereof to return said rotary table to the reference position,
wherein when the boat is being placed with the shift position thereof displaced from the reference position in a rotatable direction of said rotary table, said rotary table turns in a direction of displacement of the boat against an urging force of the urging means as the boat is guided by the guide pin, and when placement of the boat is completed, said rotary table turns in a direction opposite to the displacement direction and returns to the reference position due to the urging force of the urging means.

12. The interface apparatus according to claim 11, wherein the urging means comprises a pair of coil springs for urging said rotary table in rotatable directions thereof opposite to each other.

13. The interface apparatus according to claim 11, wherein the boat has a cut portion formed therein, the boat being guided with the cut thereof engaged with the guide pin.

14. The interface apparatus according to claim 10, wherein said positioning means comprises a cylinder mechanism for turning said rotary table.

15. The interface apparatus according to claim 14, further comprising a guide pin arranged on said rotary table for guiding the boat when the boat is placed on said rotary table, and wherein when the boat is being placed with the shift position thereof displaced from the reference position in a rotatable direction of said rotary table, the boat is guided by the guide pin, and when placement of the boat is completed, said rotary table is turned in a direction opposite to said rotatable direction and returned to the reference position by the cylinder mechanism.

16. The interface apparatus according to claim 10, wherein said positioning means comprises a motor for turning said rotary table.

17. The interface apparatus according to claim 16, further comprising a guide pin arranged on said rotary table for guiding the boat when the boat is placed on said rotary table, and wherein when the boat is being placed with the shift position thereof displaced from the reference position in a rotatable direction of said rotary table, the boat is guided by the guide pin, and when placement of the boat is completed, said rotary table is turned in a direction opposite to said rotatable direction and returned to the reference position by the motor.

18. The interface apparatus according to claim 10, wherein said first processing apparatus comprises a n application apparatus for applying a process solution to the substrate to be processed, and said second processing apparatus comprises a heating apparatus for subjecting the substrate to a heat treatment process.

19. A substrate transportation method for transporting substrates to be processed one by one to an interface apparatus after each of the substrates is subjected to single substrate processing by a first processing apparatus, placing plural substrates in a substrate holding member, transporting the substrate holding member having the plural of substrates placed therein to a second processing apparatus for subjecting batch processing to second processing, and after completion of the second processing, returning the substrate holding member to the interface apparatus, said substrate transportation method comprising the steps of:

turning a rotary table rotatably arranged on a stage inside the interface apparatus, in a direction of displacement of the substrate holding member to permit the substrate holding member to be placed on the rotary table when the substrate holding member is being placed on the rotary table with a shift position thereof displaced from a reference position in a rotatable direction of the rotary table; and turning the rotary table in a direction opposite to the displacement direction after completion of placement of the substrate holding member, to thereby position the substrate holding member at the reference position.

20. The substrate transportation method according to claim 19, wherein said first processing apparatus comprises a coating apparatus for applying a process solution to the substrate to be processed, and said second processing apparatus comprises a heating apparatus for subjecting the substrate to a heat treatment process.

21. A substrate transportation method for transporting substrates to be processed one by one to an interface apparatus after each of the substrates is subjected to single substrate processing by a first processing apparatus, placing plural substrates in a substrate holding member, transporting the substrate holding member having the plural substrates placed therein to a second processing apparatus for subjecting batch processing to second processing, and after completion of the second processing, returning the substrate holding member to the interface apparatus, said substrate transportation method comprising the steps of:

preparing urging means for urging a rotary table rotatably arranged on a stage inside the interface apparatus in opposite rotatable directions thereof such that the rotary table is always returned to a reference position;

turning the rotary table in a direction of displacement of the substrate holding member with a guide pin of the rotary table engaged and guided by the substrate holding member, against an urging force of the urging means to permit the substrate holding member to be placed on the rotary table when the substrate holding member is being placed on the rotary table with a shift position thereof displaced from the reference position in a rotatable direction of the rotary table; and turning the rotary table in a direction opposite to the displacement direction and returning the rotary table to the reference position by the urging force of the urging means after completion of placement of the substrate holding member, to thereby position the substrate holding member at the reference position.

22. The substrate transportation method according to claim 21, wherein said first processing apparatus comprises a coating apparatus for applying a process solution to a substrate to be processed, and said second processing apparatus comprises a heating apparatus for subjecting the substrate to a heat treatment process.

23. A substrate processing system comprising:

a first processing apparatus for performing single substrate processing on each of substrates to be processed;

a second processing apparatus for performing batch processing on plural substrates to be processed with the substrates held by a boat;

an interface apparatus to which the substrates processed by said first processing apparatus are transported one by one, said interface apparatus causing the substrates to be held by the boat, transporting the boat holding plural substrates to said second processing apparatus, and after completion of the batch processing, retrieving the boat;

a first transfer mechanism for loading/unloading the substrate into/from the boat in the interface apparatus; and a second transfer mechanism for transferring the boat in the interface apparatus to the second processing apparatus, said interface apparatus including:
a stage,
a rotary table rotatably arranged on said stage, for placing the boat thereon, and
a rotator that turns said rotary table in a direction of displacement of the boat to permit the boat to be placed on said rotary table when the boat is being placed on said rotary table with a shift position thereof displaced from a reference position in a rotatable direction of said rotary table by said second transfer mechanism, and after completion of placement of the boat, turning said rotary table in a direction opposite to the displacement direction to thereby position the boat at the reference position.

24. The substrate processing system according to claim 23, wherein said rotator comprises:

a guide pin arranged on said rotary table that guides the boat when boat is placed on said rotary table, and an impeller that impels said rotary table in opposite rotatable directions thereof to return said rotary table to the reference position, wherein when the boat is being placed with the shift position thereof displaced from the reference position in a rotatable direction of said rotary table, said rotary table turns in a direction of displacement of the boat against an urging force of the impeller as the boat is guided by the guide pin, and when placement of the boat is completed, said rotary table turns in a direction opposite to the displacement direction and returns to the reference position due to the urging force of the impeller.

25. The substrate processing system according to claim 24, wherein the impeller comprises a pair of coil springs to urge said rotary table in rotatable directions thereof opposite to each other.

26. The substrate processing system according to claim 24, wherein the boat has a cut portion formed therein, the boat being guided with the cut portion thereof engaged with the guide pin.

27. The substrate processing system according to claim 23, wherein said rotator comprises a cylinder mechanism that turns said rotary table.

28. The substrate processing system according to claim 27, further comprising a guide pin arranged an said rotary table for guiding the boat when said boat is placed on said rotary table, and wherein when the boat is being placed with the shift position thereof displaced from the reference position in a rotatable direction of said rotary table, the boat is guided by said guide pin, and when placement of the boat is completed, said rotary table is turned in a direction opposite to said rotatable direction and returned to the reference position by the cylinder mechanism.

29. The substrate processing system according to claim 23, wherein said rotator comprises a motor for turning said rotary table.

30. The substrate processing system according to claim 29, further comprising a guide pin arranged on said rotary table for guiding the boat when the boat is placed on said rotary table, and wherein when the boat is being placed with the position thereof displaced from the reference position in a rotatable direction of said rotary table, the boat is guided by the guide pin, and when placement of the boat is completed, said rotary table is turned in a direction opposite to said rotatable direction and returned to the reference position by said motor.

31. The substrate processing system according to claim 23, wherein said first processing apparatus comprises a coating apparatus that applies a process solution to a substrate, and said second processing apparatus heats the substrate in a heat treatment process.

32. An interface apparatus for placing in a boat a plurality of substrates transported thereto one by one from a first processing apparatus, then transports the boat having the plural substrates placed therein to a second processing apparatus for batch processing, and after completion of the batch processing, receiving the boat said interface apparatus comprising:

a stage;

a rotary table rotatably arranged on said stage, for placing the boat thereon; and a rotator for turning said rotary table in a direction of displacement of the boat to permit the boat to be placed on said rotary table when the boat is placed on said rotary table with a shift position thereof displaced from a reference position in a rotatable direction of said rotary table, and after completion of placement of the boat, to turn said rotary table in a direction opposite to the displacement direction to thereby position the boat at the reference position.

33. The interface apparatus according to claim 32, wherein said rotator comprises:

a guide pin arranged on said rotary table, for guiding the boat when the boat is placed on said rotary table; and an impeller that impels said rotary table in opposite rotatable directions thereof to return said rotary table to the reference position, wherein when the boat is placed with the shift position thereof displaced from the reference position in a rotatable direction of said rotary table, said rotary table turns in a direction of displacement of the boat against an urging force of the impeller as the boat is guided by the guide pin, and when placement of the boat is completed, said rotary table turns in a direction opposite to the displacement direction and returns to the reference position due to the urging force of the impeller.

34. The interface apparatus according to claim 33, wherein the impeller comprises a pair of coil springs that urges said rotary table in rotatable directions thereof opposite to each other.

35. The interface apparatus according to claim 33, wherein the boat has a cut portion formed therein, the boat being guided with the cut thereof engaged with the guide pin.

36. The interface apparatus according to claim 32, wherein said rotator comprises a cylinder mechanism that turns said rotary table.

37. The interface apparatus according to claim 36, further comprising a guide pin arranged on said rotary table that guides the boat when the boat is placed on said rotary table, and wherein when the boat is being placed with the shift position thereof displaced from the reference position in a rotatable direction of said rotary table, the boat is guided by the guide pin, and when placement of the boat is completed, said rotary table is turned in a direction opposite to said rotatable direction and returned to the reference position by the cylinder mechanism.

38. The interface apparatus according to claim 32, wherein said rotator comprises a motor that truns said rotary table.

39. The interface apparatus according to claim 38, further comprising a guide pin arranged on said rotary table that guides the boat when the boat is placed on said rotary table, and wherein when the boat is being placed with the shift position thereof displaced from the reference position in a rotatable direction of said rotary table, the boat is guided by the guide pin, and when placement of the boat is completed, said rotary table is turned in a direction opposite to said rotatable direction and returned to the reference position by the motor.

40. The interface apparatus according to claim 32, wherein said first processing apparatus comprises an application apparatus that applies a process solution to the substrate to be processed and said second processing apparatus comprises a heating apparatus that heats the substrate to a heat treatment process.

* * * * *